United States Patent
Cole et al.

(10) Patent No.: US 6,175,124 B1
(45) Date of Patent: Jan. 16, 2001

(54) METHOD AND APPARATUS FOR A WAFER LEVEL SYSTEM

(75) Inventors: Richard K. Cole, Woodland Park, CO (US); Scott J. Rittenhouse, Cypress, TX (US); Brad S. Tollerud, Colorado Springs, CO (US); Matthew S. Von Thun, Colorado Springs, CO (US); James P. Yakura, Colorado Springs, CO (US)

(73) Assignee: LSI Logic Corporation, Milpitas, CA (US)

( * ) Notice: Under 35 U.S.C. 154(b), the term of this patent shall be extended for 0 days.

(21) Appl. No.: 09/108,092

(22) Filed: Jun. 30, 1998

(51) Int. Cl.[7] .................................................. H01L 23/58
(52) U.S. Cl. ........................ 257/48; 257/207; 257/679; 257/531
(58) Field of Search ........................... 257/48, 620, 207, 257/531, 679; 361/821; 235/487

(56) References Cited

U.S. PATENT DOCUMENTS

| | | | |
|---|---|---|---|
| 4,732,446 | 3/1988 | Gipson et al. | 350/96.15 |
| 4,795,898 | * 1/1989 | Bernstein et al. | 235/487 |
| 4,826,272 | 5/1989 | Pimpinella et al. | 350/96.2 |
| 4,965,653 | 10/1990 | Otsuka et al. | 357/55 |
| 4,999,742 | * 3/1991 | Stampfli | 361/400 |
| 5,170,269 | 12/1992 | Lin et al. | 359/9 |
| 5,268,973 | 12/1993 | Jenevein | 385/74 |
| 5,394,490 | 2/1995 | Kato et al. | 385/14 |
| 5,399,847 | * 3/1995 | Droz | 235/488 |
| 5,500,540 | 3/1996 | Jewell et al. | 257/82 |
| 5,576,554 | 11/1996 | Hsu | 257/48 |
| 5,629,838 | 5/1997 | Knight et al. | 361/782 |
| 5,946,198 | * 8/1999 | Hoppe et al. | 361/813 |
| 6,052,498 | * 4/2000 | Paniccia | 385/14 |

FOREIGN PATENT DOCUMENTS

| 4138131 | * 4/1993 | (DE) . |
|---|---|---|
| 02806 | * 5/1987 | (WO) . |

* cited by examiner

Primary Examiner—David Hardy

(57) ABSTRACT

An improved wafer scale integrated circuit is described which includes non-contact power and data transmission coupling. Wireless power and data coupling reduces the mechanical stresses and strains on the wafer, and makes better use of the wafer area. An additional benefit comes from allowing better heat transfer management. In one embodiment, power is provided by inductive coupling. Data flow into and out of the wafer is accomplished optically, using optical detectors to receive and light emitting diodes to transmit. Multiple devices are integrated onto the semiconductor wafer. Systems may be incorporated using the traditional die sites. Connections between systems are made in the space between die sites.

46 Claims, 4 Drawing Sheets

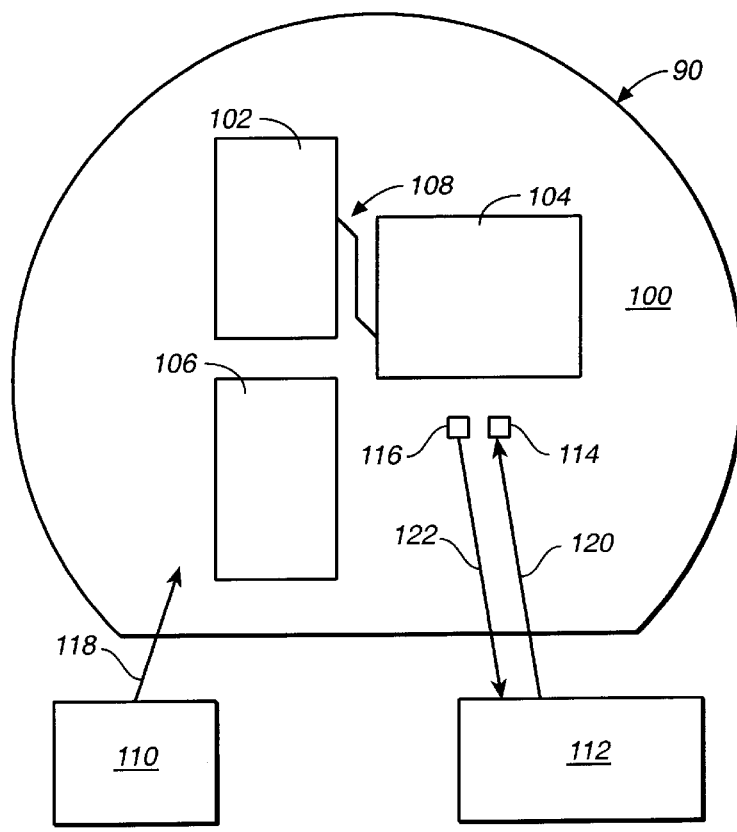
FIG._1
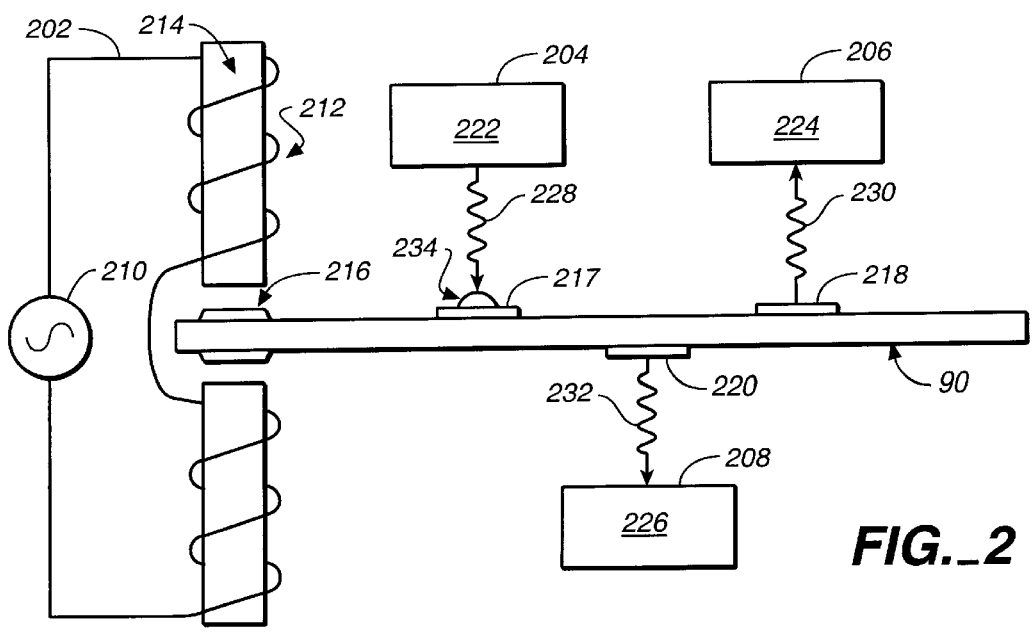
FIG._2

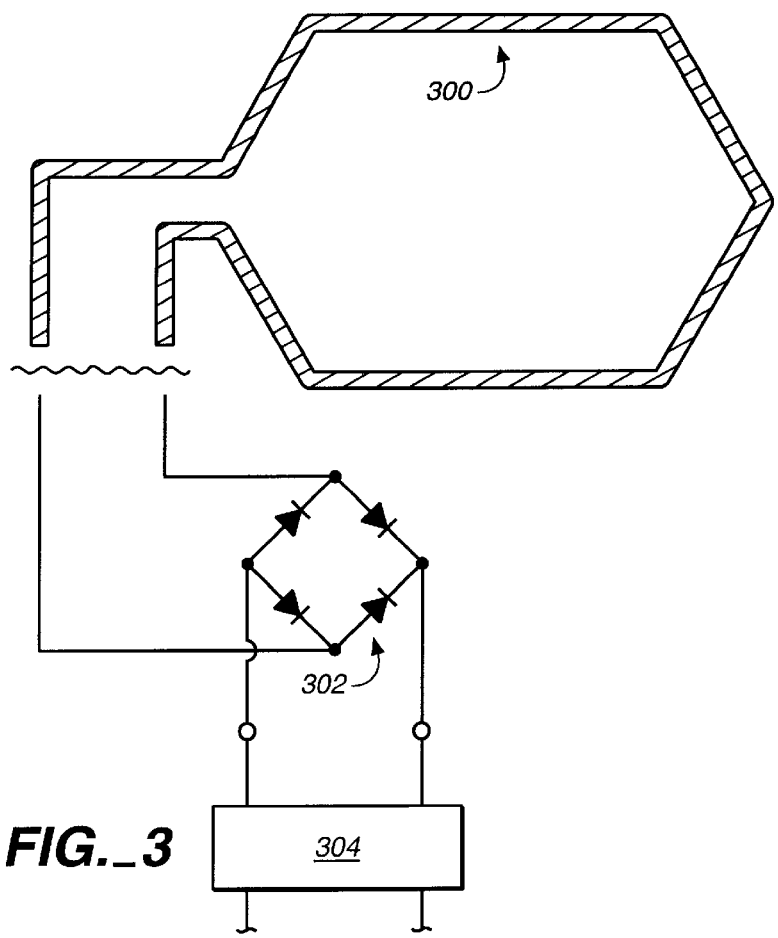
FIG._3
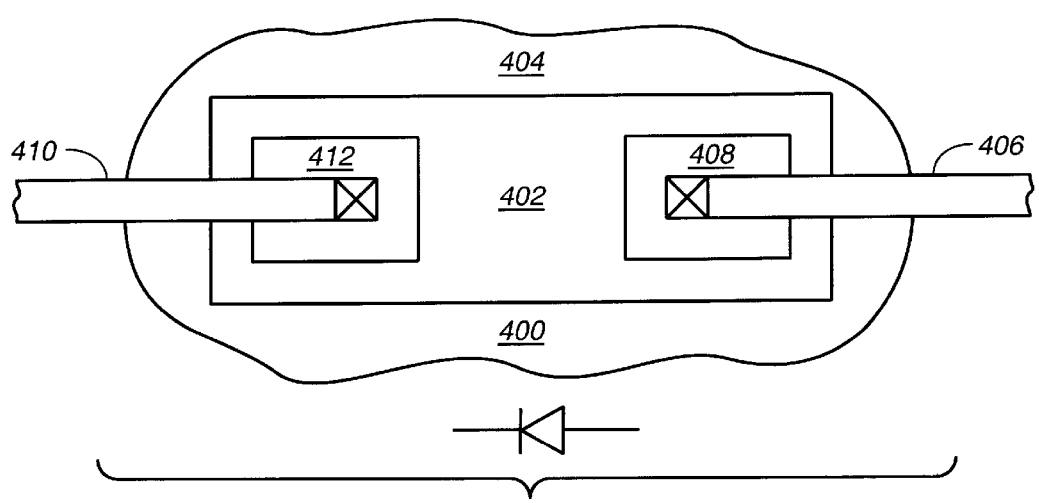
FIG._4

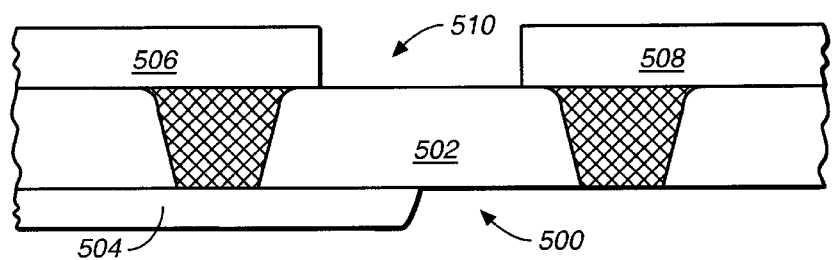
FIG._5
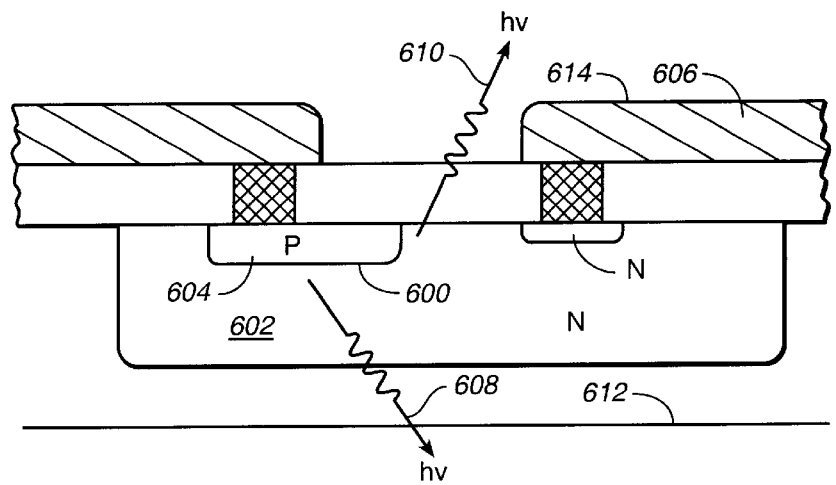
FIG._6
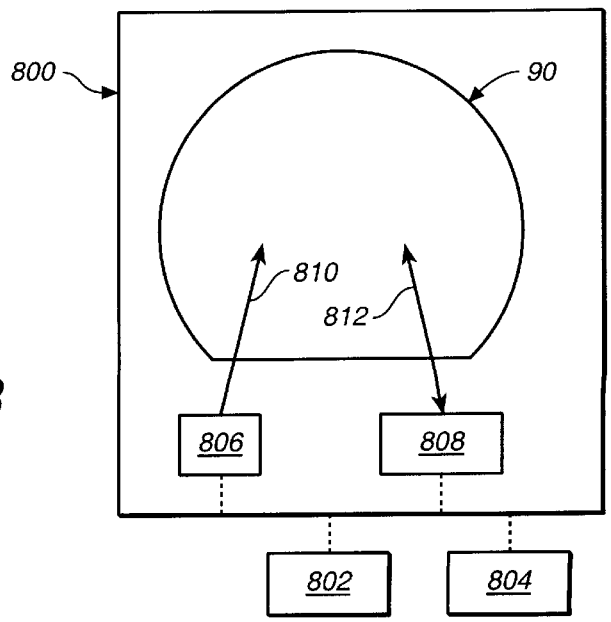
FIG._8

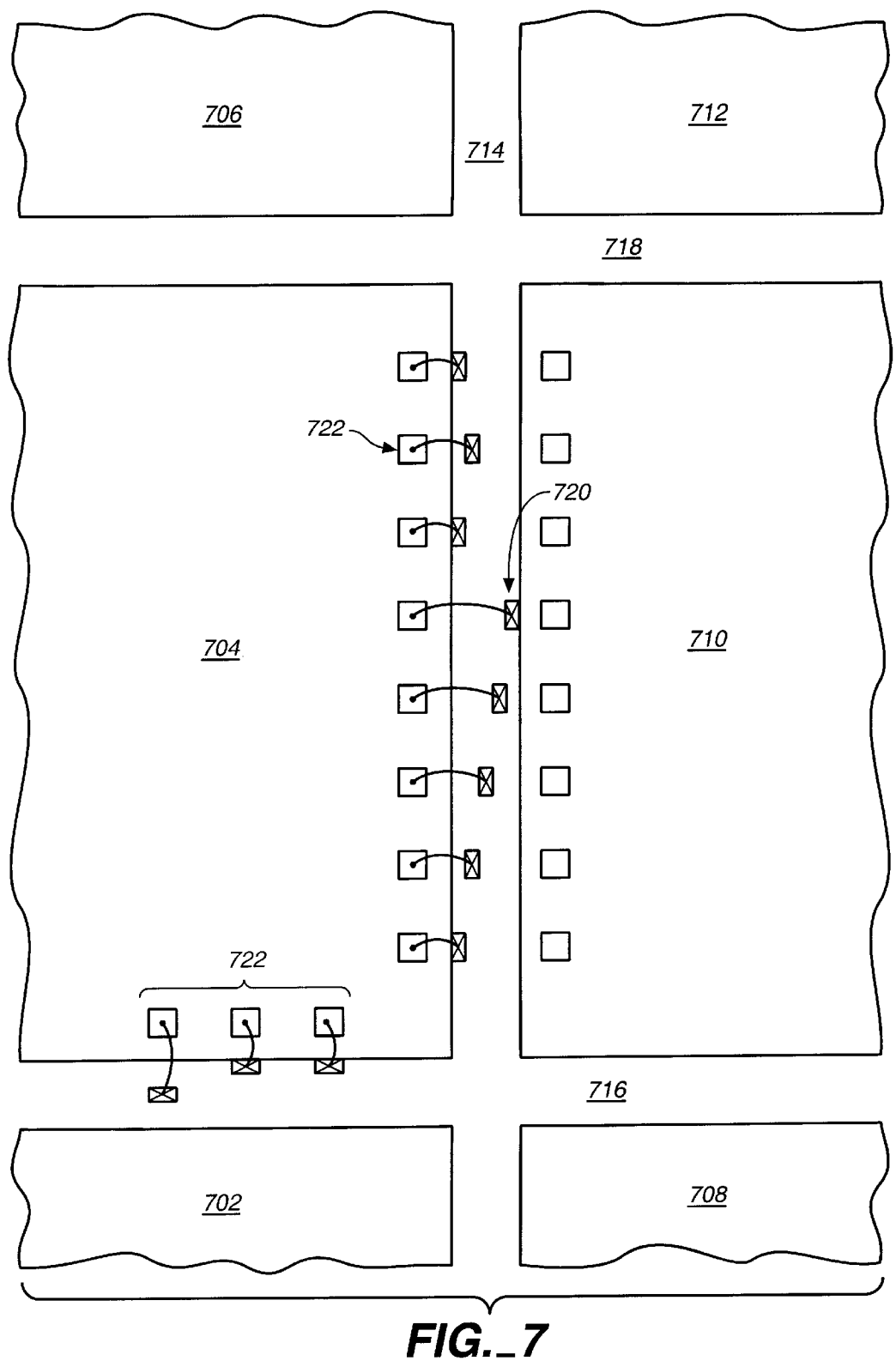
FIG._7

METHOD AND APPARATUS FOR A WAFER LEVEL SYSTEM

BACKGROUND OF THE INVENTION

1. Technical Field

The invention relates to an improved data processing system. More specifically, the invention relates to a semiconductor data processing system. Still more specifically, the invention relates to a data processing system using a wafer scale integrated circuit device.

2. Description of the Related Art

In manufacturing integrated circuits, one difficulty that manufacturers of integrated circuits are faced with is that with increasing functionality of integrated circuits, an increase of the complexity of the packaging required to provide mechanical protection and an interface for power and signals between the integrated circuit encapsulated in a package and other integrated circuits in other packages. Along with the increasing complexity of the package comes a problem with radiating waste heat generated by the die containing the integrated circuit encapsulated in a package.

One approach employed by manufacturers is creating an integrated circuit system using an entire wafer, rather than separating dies in the wafer, encapsulating the dies in separate packages, and placing the packaged dies on a board to create the integrated circuit system. A wafer scale integrated circuit (WSIC) device is made up of an array of undiced chips or modules. These chips or modules could include, for example, data storage circuitry (DRAM, SDRAM, etc) or digital and analog data processing circuitry (digital signal processors, microprocessors, A/D converters, etc). The ability to practically fabricate wafer scale integrated circuits has been advanced by recent improvements in overall defect levels, or yield, and in the ability to perform such post processing steps as laser trimming and fusible links. See, for example, U.S. Pat. Nos. 5,576,554 and 5,126,828. Using these techniques, nonfunctional sites can be selectively disabled. Wafer scale integrated circuits enable circuitry that operates at faster speeds, and electronic systems that occupy smaller volumes.

Otsuka, et al (U.S. Pat. No. 4,965,653) discusses several practical problems encountered in wafer scale integration. Wafer scale integrated circuits call for a significant increase in the number of data input and output channels. These are conventionally delivered using mechanical wire connections. These large number of mechanical connections, especially when compounded with an increased circuit area, gives rise to physical stresses and strains, which can deleteriously effect the delicate silicon or GaAs crystal structure.

Often the data and power wire connections are made with ball bonds, and are very large relative to other circuit feature sizes. Further, these bond pads must be made even larger than necessary, to allow for mechanical alignment tolerances in the ball bonding process. Thus, the use of a large number of wire connections provides an inefficient use of the wafer since semiconductor which could be used for logic circuitry is devoted to mechanical interconnects.

Thermal management issues also become more difficult as the area of the integrated circuitry grows. Thus heat removal becomes a challenge in wafer scale integrated circuits. If the device is insufficiently cooled, the operational characteristics deteriorate.

Therefore it would be advantageous to have an improved wafer scale integrated circuit device with improved packaging.

SUMMARY OF THE INVENTION

It is one object of the present invention to provide an improved wafer scale integrated circuit device.

It is another object of the present invention is to eliminate ball bond type connections to and from the wafer and thereby reduce stresses in the wafer and to eliminate wasted area.

It is yet another object of the present invention to allow for improved thermal management, by separating the electrical conduction from the thermal conduction. More efficient schemes for heat removal may be used because of this invention.

It is an additional another object of the present invention to allow improved electrical isolation of the wafer scale integrated circuitry.

The present invention provides an improved wafer scale integrated circuit is described which includes non-contact power and data transmission coupling. Wireless power and data coupling reduces the mechanical stresses and strains on the wafer, and makes better use of the wafer area. An additional benefit comes from allowing better heat transfer management. In one embodiment, power is provided by inductive coupling. Data flow into and out of the wafer is accomplished optically, using optical detectors to receive and light emitting diodes to transmit. Multiple devices are integrated onto the semiconductor wafer. Systems may be incorporated using the traditional die sites. Connections between systems are made in the space between die sites.

The present invention achieves these objects along with other object that will become apparent in the following description a preferred embodiment of the present invention.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a schematic view of a wafer scale integrated circuit device showing power input and data in/out in accordance with a preferred embodiment of the present invention;

FIG. 2 shows a side view of the contactless wafer scale integrated circuit device along with a transformer primary, and optical data links in accordance with a preferred embodiment of the present invention;

FIG. 3 is a diagram of a mechanism for receiving power on a wafer scale integrated circuit device in accordance with a preferred embodiment of the present invention;

FIG. 4 is a diagram of a diode used in a diode bridge full wave rectifier in accordance with a preferred embodiment of the present invention;

FIG. 5 is a cross sectional view of one embodiment of input data detector in accordance with a preferred embodiment of the present invention;

FIG. 6 is a cross sectional view of light emitting diode for output data transmission in accordance with a preferred embodiment of the present invention;

FIG. 7 is a diagram displaying the top view of wafer scale integrated circuit device with dies in accordance with a preferred embodiment of the present invention; and FIG. 8 is a diagram of the use of wafer scale integrated circuit device in conjunction with an electronic system in accordance with a preferred embodiment of the present invention.

DETAILED DESCRIPTION

The present invention in a broad sense comprises a semiconductor wafer or large die, which contains electronic circuitry. No mechanical wire connections are made to this wafer or large die from the outside world. The present invention employs reduced coupling parasitics and improved noise figures result from the use of this invention. Power and data are delivered to the wafer scale device without mechanical contacts. Similarly data is transmitted out of the wafer scale device without mechanical contacts. The contactless power delivery to the electronic circuitry is accomplished using an inductively coupled power supply. For example, two or more metalization levels can be deposited at the perimeter of the wafer to function as a flattened solenoid. Multiple implementations of this can provide redundancy, or provide an individual power supply for each function section of the wafer scale circuit. In one implementation, an alternating signal drives the solenoid, and a rectifier, such as a diode bridge, may be used to convert to direct current power. In another implementation, the wafer can rotate through a constant magnetic field, and a power regulation circuit can be used to control the power to the circuitry. It is necessary that the magnetic field be localized spatially to prevent Hall effects from disturbing the proper function of the circuitry. Any other metal not necessary for the inductively coupled power supply must be removed from the region of the magnetic fields to prevent eddy currents from creating unwanted heating of the wafer. In this manner power may be delivered to the wafer scale integrated circuit in a wireless coupling.

Power may also be delivered to the wafer scale device without mechanical contact by shining a light on a photocell on the wafer. In this manner, power may be delivered to the wafer scale integrated circuit in a wireless coupling.

Contactless data flow into the wafer scale device can be accomplished through optical receivers. Light focused at selected locations on the wafer may serve to discharge a pre-charged node that would then be sensed by changes in voltage and current on associated circuitry. Similarly, by proper choice of input light wavelength and junction construction, specific regions of the wafer's surface may be used as photodiodes. In this manner, data may be delivered to the wafer scale integrated circuit device in a wireless coupling. Contactless data flow out of the wafer scale integrated circuit device can be accomplished through optical transmitters. Light emitting diodes may be fabricated directly on the wafer surface for output, and detected remotely. Other advanced semiconductor based optical sources may be used to provide output data signals, including lasers (especially vertical cavity surface emitting lasers) and porous silicon. An alternate output scheme uses deposition of electroluminescent polymers. An alternate output scheme would use the infrared light created by carrier recombination at specific nodes and detected at the back surface through the wafer's thickness. All of these optical outputs can be focused by microlenses into optical fibers, or remote detectors.

Contactless data flow into and out of the wafer scale integrated circuit device can also be accomplished using an electron beam to charge selected nodes for input, and to detect charged nodes for output. In this configuration, the functional side of the wafer is exposed to a vacuum.

The invention also provides for an efficient use of wafer area. In addition to reduced input/output area usage, the area between dies where the scribe lines would normally be, is used to locate transmission line data buses connecting the individual circuit function sections, or dies.

Wither reference now to the figures and in particular with reference to FIG. 1, an exemplary embodiment of a contactless wafer scale integrated circuit device 90 according to the present invention is made up of semiconductor wafer 100 on which has been made integrated circuit regions, circuit blocks or dies as found in regions 102, 104, and 106. By example, without limitation, the wafer in a preferred embodiment is made up of silicon, and more specifically p-doped silicon. The wafer is not limited to any one substrate and can be composed of GaAs, Ge, or semiconductor-on-insulator. The circuit regions, or dies, have been fabricated using photolithographic or other semiconductor manufacturing techniques. The circuit regions could be memory arrays, logic arrays or a combination of the two, such as a signal processor or a microprocessor. Other circuitry such as analog circuits also may be found in the circuit regions. Regions 102 and 104 in the depicted example are operable die regions, which may be electrically connected with lines 108 located in the scribe regions between circuit regions. Region 106 is depicted as a non-operable die region, which may not be connected to lines 108. Wafer scale integrated circuit device 90 is coupled in a wireless manner to outside sources of power 110 and data 112.

Located on wafer scale integrated circuit device 90 are light detector 114 and light transmitter 116. Alternatively, electron beams may be used to transfer data. Electron beams may be used in the depicted example, if the functional side of the wafer is exposed in a vacuum. In such an environment, an electron beam may be used to select nodes for input and to detect charged nodes for output. In this implementation, light detector 114 would be replaced with a node that may be charged by an electron beam to input data and light transmitter 116 would be replaced with a node that becomes charged for detection by an electron beam to output data. The output may be detected in a manner similar to that employed by a contrast Scanning Electron Microscope (SEM). Power flows from the outside sources of power 110 through inductive coupling field 118. Data flows to and from outside source of data 112 through communications links 120 and 122. These communications links are wireless links, which require no physical connection to wafer scale integrated circuit device 90. Data enters wafer scale integrated circuit device 90 through light detector 114. Light transmitter 116 transmits communications link 122 to the outside source of data 112. A novel feature of the invention is that coupling field 118 and communications links 120 and 122 are non-mechanical, wireless links that may be implemented using inductive fields, optical fields, electron beams and other non-mechanical forms of energy.

By example, without limitation, the wafer scale integrated circuit device has application in large arrays of memory. In this case, the circuit blocks would be substantially the same DRAM, SDRAM or other memory array. Wafer scale integrated circuit device 90 also has application in specialized composite circuitry wherein related circuit blocks are made on the same wafer to achieve a specialized processing task including graphics and video processing, or telecommunication switching and routing. Wafer scale integrated circuit device 90 also has application in general composite circuitry wherein the circuit blocks, or dies, are chosen to comprise a microcomputer on a wafer. In all these applications, the final system package would be compact, and the data flow would be achieved at improved bandwidth over existing non-wafer scale electronic systems.

In accordance with a preferred embodiment of the present invention, FIG. 2 shows a side view of the contactless wafer scale integrated circuit device 90 along with a transformer primary 202, and optical data links 204, 206, and 208. The transformer primary 202 may consist of alternating current source 210 wired in loops 212 around a ferrous core shown here in cylindrical form 214. A transformer secondary 216 is attached to the wafer proximate to transformer primary 202. Transformer primary 202 and transformer secondary 216 are spaced closely enough so that power is exchanged from the first to the second through an inductive electromagnetic field. Connected to the wafer scale integrated circuit device 90 is input data detector 217. In a preferred embodiment, data detectors may by implemented by photodiodes or phototransistors, as is well known in the art. In a preferred embodiment, data transmitters may be implemented by light emitting diodes or semiconductor lasers. Also connected to wafer scale integrated circuit device 90 are output data transmitters 218 and 220. Wafer scale integrated circuit device 90 is coupled in a wireless manner to at least one input data transmitter 222 and at least one output data detector, such as data detectors 224 or 226. Input data transmitter 222, data detector 224, and data detector 226 are components external to wafer scale integrated circuit device 90. Wireless coupling of the transmitter and these detectors is accomplished through radiative fields 228, 230, and 232. Input data transmitter 222 transmits optical data through radiative field 228, which is detected by input data detector 217. Lens 234 may be used to increase the collection efficiency of the link. Output data transmitters 218 and 220 emit radiative fields 230 and 232 in the form of light. These radiative fields are used to transmit data from the contactless wafer scale integrated circuit device 90 to output data detectors 224 and 226. In accordance with a preferred embodiment of the present invention, both sides of the wafer may be used for data and power flow.

Referring now to FIG. 3, a diagram of a mechanism for receiving power on a wafer scale integrated circuit device 90 is depicted in accordance with a preferred embodiment of the present invention. In the depicted example, at least two metalization levels are used at the primitive of the wafer to form what essentially comes a flattened solenoid. Although the depicted example shows a single loop, the solenoid may include additional loops, which are not shown in FIG. 3. Additional loops may be used to increase the voltage generated by the solenoid. Loop 300, which forms the solenoid of the transformer secondary 216 is connected to diode bridge full wave rectifier 302 which in turn is then connected to low pass filter block 304. The ends of the solenoid in this example are connected to diode bridge full wave rectifier 302, but also may be connected to a power regulating circuit depending on whether the wafer rotates with these solenoids passing beneath a constant magnetic field or if the wafer remains stationary with the magnetic filed varying in the time domain. In the depicted example, the magnetic field is generated to the localized spacially to prevent Hall effects from disturbing the proper function of the circuitry. In this example, other metal not necessary for the inductively coupled power supply should be removed from the region of magnetic fields to minimize or prevent eddy currents from creating unwanted heat from the wafer.

In loop 300, transformer secondary 216 receives the induction field from transformer primary 202. Diode bridge full wave rectifier 302 and low pass filter block 304 are known methods of converting an alternating current electrical signal to a direct current signal which may be used to bias the logic transistors. Diode bridge full wave rectifier 302 converts an alternating current electrical signal that alternates between positive and negative values to one which varies between zero and positive signal values. Low pass filter block 304 integrates the rectified signal so that the output signal remains positive, and substantially at one value.

Turning now to FIG. 4, a diagram of a diode used in a diode bridge full wave rectifier from FIG. 3 is shown in accordance with a preferred embodiment of the present invention. In the depicted example, diode element 400 is used in diode bridge full wave rectifier 302. Diode element 400 includes an n-doped well 402 that is fabricated in an overall p-doped substrate 404. Metal lead 406 connects to a p+ implant region 408. Metal lead 410 connects to a n+ implant region 412. This structure may be made in silicon using the standard techniques of photolithographic semiconductor manufacturing.

Turning to FIG. 5, a cross sectional view of one embodiment of input data detector 217 is depicted in accordance with a preferred embodiment of the present invention. Input data detector 217 from FIG. 2 is formed in a p-type substrate 500, which supports a microelectronic structure including a transparent region 502, an n-doped photocurrent source region 504, a positively pre-charged line 506, and a positively biased drain line 504. Drain line 504 is reversed biased with respect to p-type substrate 500. In addition, transparent region 502 may be replaced with a semitransparent region depending on the implementation. In the absence of light, pre-charged line 506 remains at high potential for a long period of time. The only current is the dark current, the reverse saturation current. Data arrives on light input 510 from an input transmitter and strikes the junction between 500 and 504. These photons create electron hole pairs in the transition region. These carriers are swept out of transparent region 502 as photocurrent that acts to discharge the pre-charged sensing line on pre-charged line 506. Voltage change on drain 508 comprises the data now on contactless wafer scale integrated circuit device 90. Input data detector 217 may be used in this invention to receive data from an outside source. In the depicted example, p-type and n-type may be reversed if polarities are switched.

Turning now to FIG. 6, a cross sectional view of data transmitter 218 from FIG. 2 displaying a light emitting diode for output data transmission is depicted in accordance with a preferred embodiment of the present invention. In the depicted example, a silicon substrate is employed for infrared detectors. Data transmitter 218 includes light emitting diode containing junction 600, which is formed between an n-doped well 602 and a p-doped feature 604. Data transmitter 218 displays the light emitting diode which also includes a metalization layer 606. When junction 600 is forward biased, junction 600 emits photons, such photons 608 and 610, with energy determined by the bandgap. This generally infrared light can be detected through back surface 612 of the wafer or through front surface 614 of the wafer if there is a gap in metalization layer 606. Data transmitter showing a light emitting diode is used in this invention to transmit data to an outside detector.

Turning to FIG. 7, a diagram displaying the top view of wafer scale integrated circuit device 90 with dies 702, 704, 706, 708, 710 and 712 is depicted in accordance with a preferred embodiment of the present invention. Between these dies are scribe lines 714, 716 and 718. In scribe lines 714, 716, and 718 are data lines 720. At the edges of the dies are bond pads 722. If the die is operative, such as die 704, then bond pads 722 of the die are used to interface the circuitry on the die with other operating dies. This interface is accomplished by connecting data lines 720 to bond pads 722. If the die is inoperative, such as die 710, then no connection is made to bond pads 722. This aspect of the invention achieves efficient use of the silicon substrate and allows for defective circuit regions.

Referring now to FIG. 8, a diagram of the use of wafer scale integrated circuit device 90 in conjunction with an electronic system 800 is depicted in accordance with a preferred embodiment of the present invention. For example and without limitation, electronic system 800 may be an electronic computer, a robot, or a telecommunication switch. Electronic system 800 may be connected to other systems or devices, such as devices 802 and 804, including, but not limited to monitors, sensors, switches, motors, or interfaces. As is taught in this invention, wafer scale integrated circuit device 90 is coupled in a wireless manner to power module 806. Wafer scale integrated circuit device 90 is also coupled in a wireless manner to data module 808. Power module 806 may or may not be connected to electronic system 800. Data module 808 may or may not be connected to electronic system 800. The present invention allows individual modules on the wafer to be separately testable by a wafer probe without needing inductively coupled external power. Non-functional sites may be selectively disabled using methods, such as fusible links, laser trimming, or by non-connection to power or data lines on the wafer. In a preferred embodiment, power is transferred from power module 806 to wafer scale integrated circuit device 90 by inductive field 810. In a preferred embodiment, data is exchanged between data module 808 and wafer scale integrated circuit device 90 by optical link 812.

Thus, the present invention provides an improved method and apparatus for manufacturing integrated circuit systems. The present invention achieves this advantage by providing mechanisms to transmit power to a wafer scale integrated circuit device without physical contacts. The depicted example supplies power to the wafer scale and the wafer scale integrated circuit device by inductively coupling a transformer secondary coil formed on the wafer to an external primary coil. Data is transferred between the wafer and external sources by light sources and detectors, such as light emitting diodes and photo diodes formed on the wafer. Also, the present invention uses scribe lines between dies for power and signal bus lines. In this manner, the present invention provides an essentially contactless package for integrated circuit devices.

The present invention also allows for efficient, high speed connection to a wafer scale integrated circuit device.

Further modifications and alternative embodiments of this invention will be apparent to those of ordinary skill in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size and arrangement of parts. For example, equivalent elements or materials may be substituted for those illustrated and described herein, and certain features of the invention may be utilized independently of the use of other features, all as would be apparent to one of ordinary skill in the art after having the benefit of this description of the invention.

The description of a preferred embodiment of the present invention has been presented for purposes of illustration and description, but is not limited to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. An integrated circuit comprising:
    a semiconductor substrate;
    an electronic device formed on the semiconductor substrate; and
    power means formed on the semiconductor substrate and electronically connected to the
    electronic device, wherein the power means receives power through inductive coupling for use by the electronic device.

2. The integrated circuit of claim 1 further comprising wireless data transfer means for receiving and transmitting data to and from the electronic device.

3. An integrated circuit comprising:
    a semiconductor substrate;
    an electronic device formed on the substrate;
    power means for receiving power for use by the electronic device, wherein the power means uses inductive coupling to receive power; and
    wireless data transfer means for receiving and transmitting data to and from the electronic device, wherein the data transfer means employs optical coupling to receive and transmit data.

4. The integrated circuit of claim 1, wherein the semiconductor substrate is a semiconductor wafer.

5. The integrated circuit of claim 1, wherein the wafer is a silicon wafer.

6. The integrated circuit of claim 1, wherein the electronic device is a memory element.

7. The integrated circuit of claim 1, wherein the electronic device is a logic element.

8. The integrated circuit of claim 1 wherein device has a secondary transformer which receives inductive power when it is proximate to a first transformer.

9. An integrated circuit comprising:
    a semiconductor substrate;
    an electronic device formed on the substrate;
    power means for receiving power for use by the electronic device, wherein the power means uses inductive coupling to receive power;
    wireless data transfer means for receiving and transmitting data to and from the electronic device;
    additional electronic devices;
    a plurality of scribe lines formed within the semiconductor substrate, wherein the electronic device and the additional electronic devices are segregated using a plurality of scribe lines formed in the semiconductor substrate; and
    a plurality of data lines formed within the scribe lines, wherein the plurality of data lines interconnect the electronic device and the additional electronic devices.

10. A wafer scale integrated circuit device comprising:
    a wafer;
    a plurality of semiconductor devices formed on the wafer; and
    wireless power and data interface formed on the wafer and connected to the plurality of semiconductor devices, wherein the wireless power and data interface supplies power to the electronic device and facilitates data transfer to and from the electronic device.

11. The wafer scale integrated circuit device of claim 10, wherein power is delivered to the wireless power and data interface by inductive coupling.

12. The wafer scale integrated circuit device of claim 10, wherein the power is delivered to the wireless power and data interface by an optical beam.

13. The wafer scale integrated circuit device of claim 10, wherein the data is transmitted on the wireless power and data interface optically.

14. The wafer scale integrated circuit device of claim 10, wherein the data is transmitted to the wireless power and data interface by an electron beam.

15. The wafer scale integrated circuit device of claim 10, wherein the data is transmitted from the wireless power and data interface optically.

16. The wafer scale integrated circuit device of claim 10, wherein the data is read from the wireless power and data interface by electron beam scanning of charged nodes formed on the wafer.

17. The wafer scale integrated circuit device of claim 10, wherein the wafer is a semiconductor wafer.

18. The wafer scale integrated circuit device of claim 17, wherein the semiconductor wafer is a silicon wafer.

19. The wafer scale integrated circuit device of claim 10 further comprising:
   a plurality of scribe lines, wherein the plurality of scribe lines separates the plurality of semiconductor devices;
   a plurality of power lines formed within the plurality of scribe lines, wherein the plurality of power lines provide a connection between the power and data interface and the plurality of semiconductor devices; and
   a plurality of data lines formed within the plurality of data lines, wherein the plurality of data lines provide a connection between the power and data interface and the plurality of semiconductor devices.

20. A wafer scale integrated circuit system comprising:
   a semiconductor wafer;
   a plurality of circuit blocks, wherein the power of circuit blocks contains semiconductor devices;
   a plurality of scribe lines separating the plurality of circuit blocks;
   interconnect circuitry including signal lines formed in the scribe lines, the interconnect circuitry being used to interconnect the plurality of circuit blocks; and
   power means for receiving power from a source located off the semiconductor wafer, wherein power is received through inductive coupling, and wherein the power means has a connection to the interconnect circuitry to provide power to the plurality of circuit blocks.

21. The wafer scale integrated circuit system of claim 20, wherein means for transmitting and receiving data is accomplished through optical coupling.

22. The wafer scale integrated circuit system of claim 20, wherein the semiconductor wafer is a silicon wafer.

23. The wafer scale integrated circuit system of claim 20, wherein the plurality of circuit blocks includes a memory array.

24. The wafer scale integrated circuit device of claim 20, wherein the plurality of circuit blocks includes a logic array.

25. The wafer scale integrated circuit device of claim 20, wherein the power means includes a secondary transformer, which receives inductive power when the secondary transformer is proximate to a primary transformer.

26. A data processing system comprising:
   a wafer;
   a plurality of electronic devices;
   wireless power interface formed on the wafer; wherein the wireless power interface is connected to the plurality of electronic devices; and
   wireless data interface formed on the wafer, wherein the wireless data interface is connected to the plurality of electronic devices.

27. The data processing system of claim 26, wherein the plurality of electronic devices form a communications system.

28. The data processing system of claim 26, wherein the plurality of electronic devices form a computer.

29. The data processing system of claim 26, wherein the power is delivered to the wireless power interface by inductive coupling.

30. The data processing system of claim 26, wherein the power is delivered to the wireless power interface by an optical beam.

31. The data processing system of claim 26, wherein the data is transmitted to wireless data interface optically.

32. The data processing system of claim 26, wherein the data is transmitted to the wireless data interface by an electron beam.

33. The data processing system of claim 26, wherein the data is read from the wireless data interface by electron beam scanning of charged nodes.

34. The data processing system of claim 26, wherein the wafer is a semiconductor wafer.

35. The data processing system of claim 34, wherein the semiconductor wafer is silicon.

36. A method of fabricating a wafer scale integrated circuit device comprising:
   forming a plurality of electronic devices on a semiconductor wafer;
   forming a wireless power reception means the semiconductor wafer;
   forming a wireless data link on the semiconductor wafer; and
   connecting the wireless power reception means and the wireless data link to at least one of the plurality of electronic devices.

37. The method of claim 32, wherein the connecting step comprises:
   forming a plurality of scribe lines, wherein the plurality of scribe lines separate the plurality of electronic devices from each other;
   forming a plurality of signal lines, wherein the plurality of signal lines includes a first portion of signal lines and a second portion of signal lines;
   connecting a first portion of signal lines between the wireless data link and at least one of the plurality of electronic devices; and
   connecting a second portion of signal lines between the power reception means and at least one of the plurality of electronic devices.

38. The method of claim 32, wherein the plurality of signal lines includes a third portion of signal lines and further comprising:
   interconnecting the plurality of electronic devices using a third portion of the plurality of signal lines.

39. The method of claim 32, wherein power is delivered to the power reception means by inductive coupling.

40. The method of claim 36, wherein the power is delivered to the power reception means by an optical beam.

41. The method of claim 36, wherein the data is transmitted to the wireless data link optically.

42. The method of claim 36, wherein the data is transmitted to the wireless data link by an electron beam.

43. The method of claim 36, wherein the data is transmitted from the device optically.

44. The method of claim 36, wherein the wireless data link includes charged nodes and the data is read from the wireless data link by electron beam scanning of charged nodes.

45. The method of claim 36, wherein the wafer is a semiconductor wafer.

46. The method of claim 45, wherein the semiconductor wafer is a silicon wafer.

* * * * *